(12) United States Patent
Liao et al.

(10) Patent No.: US 11,810,908 B2
(45) Date of Patent: Nov. 7, 2023

(54) WAFER-LEVEL 3D INTEGRATION OF HIGH VOLTAGE OPTICAL TRANSFORMER

(71) Applicant: META PLATFORMS TECHNOLOGIES, LLC, Menlo Park, CA (US)

(72) Inventors: Christopher Yuan Ting Liao, Seattle, WA (US); Maik Andre Scheller, Redmond, WA (US); Jonathan Robert Peterson, Woodinville, WA (US); Ehsan Vadiee, Redmond, WA (US); John Goward, Redmond, WA (US); Anurag Tyagi, Kirkland, WA (US); Andrew John Ouderkirk, Kirkland, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 228 days.

(21) Appl. No.: 17/326,777

(22) Filed: May 21, 2021

(65) Prior Publication Data
US 2022/0375910 A1  Nov. 24, 2022

(51) Int. Cl.
| | |
|---|---|
| *H01L 25/16* | (2023.01) |
| *H01L 31/02* | (2006.01) |
| *H01L 31/0224* | (2006.01) |
| *H01L 31/04* | (2014.01) |
| *H01L 31/18* | (2006.01) |

(52) U.S. Cl.
CPC ...... *H01L 25/167* (2013.01); *H01L 31/02021* (2013.01); *H01L 31/022425* (2013.01); *H01L 31/04* (2013.01); *H01L 31/18* (2013.01)

(58) Field of Classification Search
CPC . H01L 31/0232; H01L 31/1016; H01L 31/12; H01L 31/167
See application file for complete search history.

(56) References Cited

U.S. PATENT DOCUMENTS

2020/0350742 A1   11/2020   Chung et al.

FOREIGN PATENT DOCUMENTS

| DE | 112017008235 T5 | 8/2020 |
|---|---|---|
| WO | 0171820 A2 | 9/2001 |

OTHER PUBLICATIONS

Lu et al., "3D Integration Using Adhesive, Metal, and Metal/Adhesive as Wafer Bonding Interfaces", Materials Research Society, vol. 1112, 2009, 12 pages.

(Continued)

*Primary Examiner* — Matthew L Reames
(74) *Attorney, Agent, or Firm* — Greenberg Traurig, LLP

(57) ABSTRACT

A method of forming a high voltage optical transformer includes forming a via through a transparent carrier wafer, forming a conductive layer within the via, bonding a solid state lighting (SSL) package to a first side of the carrier wafer, and bonding a photovoltaic (PV) wafer to a second side of the carrier wafer opposite to the first side. The photovoltaic wafer may include an active area and a conductive area located outside of the active area that is in electrical contact with the conductive layer. The method further includes forming both an SSL contact with the solid state lighting package and a PV contact with the conductive layer on the same side of the carrier wafer.

16 Claims, 12 Drawing Sheets

(Continued)

(56) References Cited

OTHER PUBLICATIONS

Masson et al., "Pushing the limits of concentrated photovoltaic solar cell tunnel junctions in novel high-efficiency GaAs phototransducers based on a vertical epitaxial heterostructure architecture", Progress in photovolaics: Research and Applications, vol. 23, Oct. 29, 2015, 10 pages.

International Search Report and Written Opinion for International Application No. PCT/US2022/029354, dated Aug. 2, 2022, 12 pages.

C

D

WAFER-LEVEL 3D INTEGRATION OF HIGH VOLTAGE OPTICAL TRANSFORMER

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
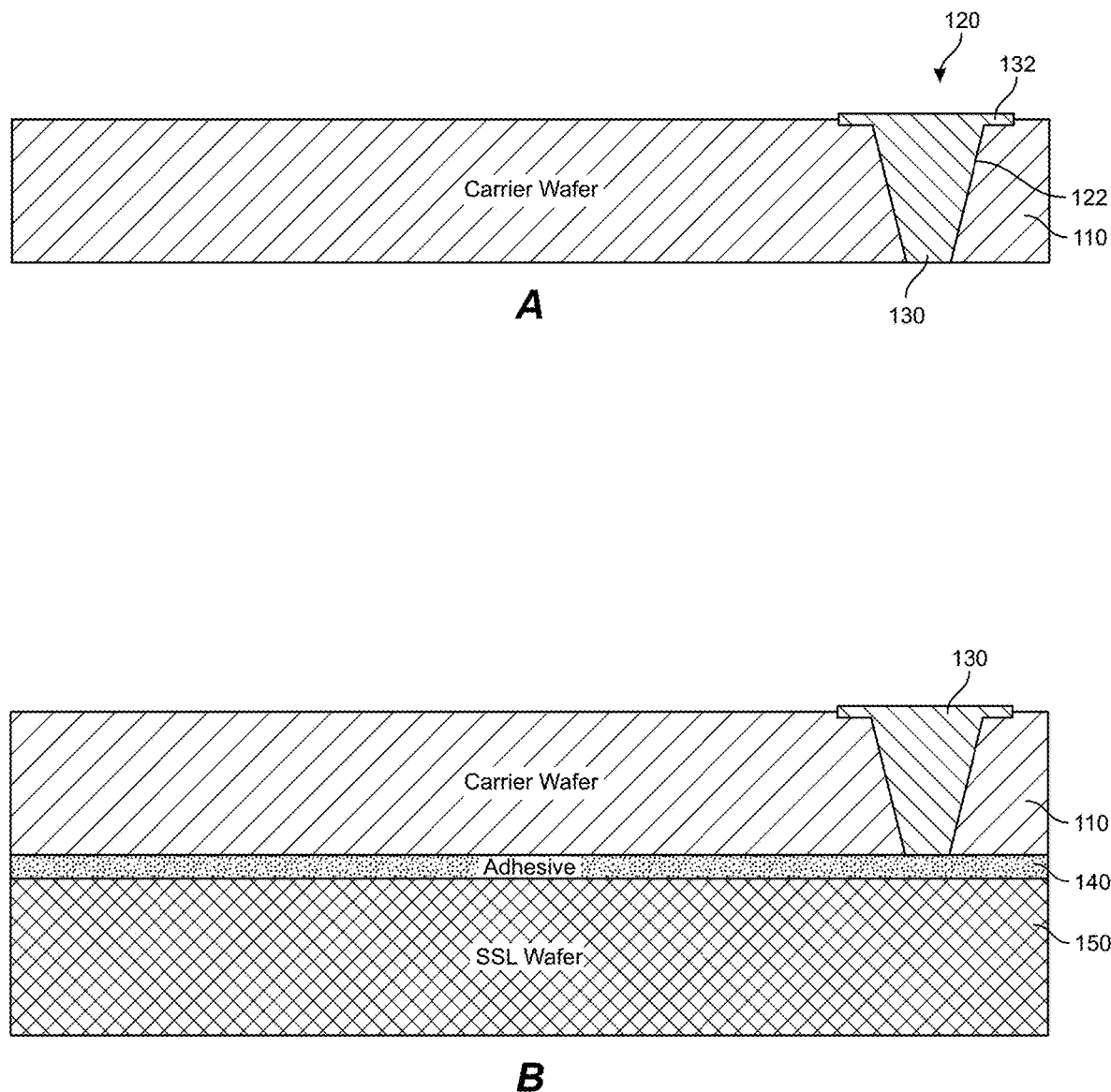
FIG. 1 illustrates a method of manufacturing a high voltage optical transformer according to some embodiments.
Figure 1:
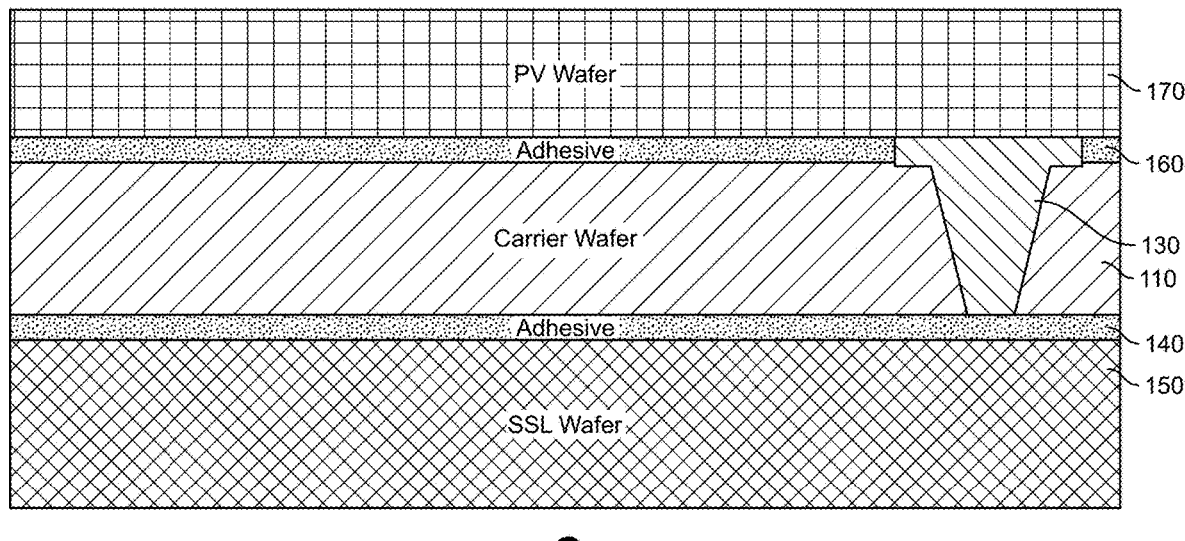
Figure 1:
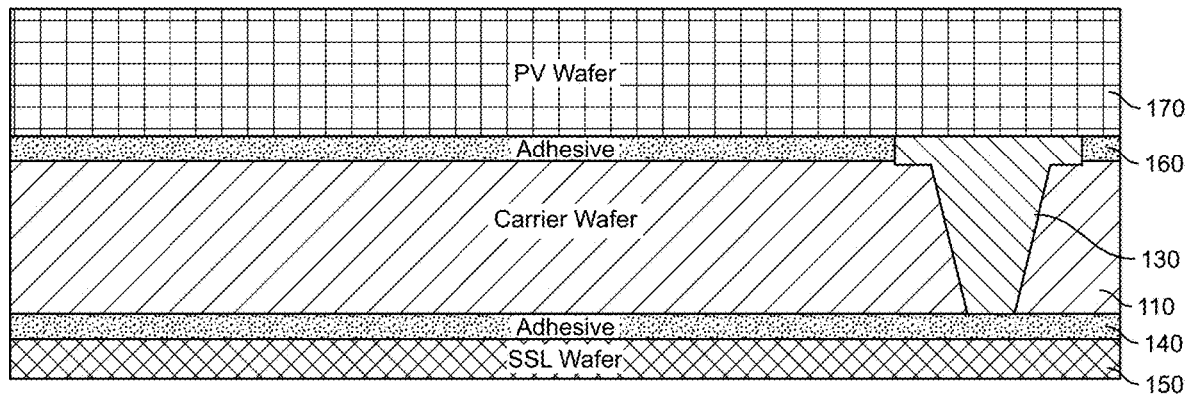
Figure 1:
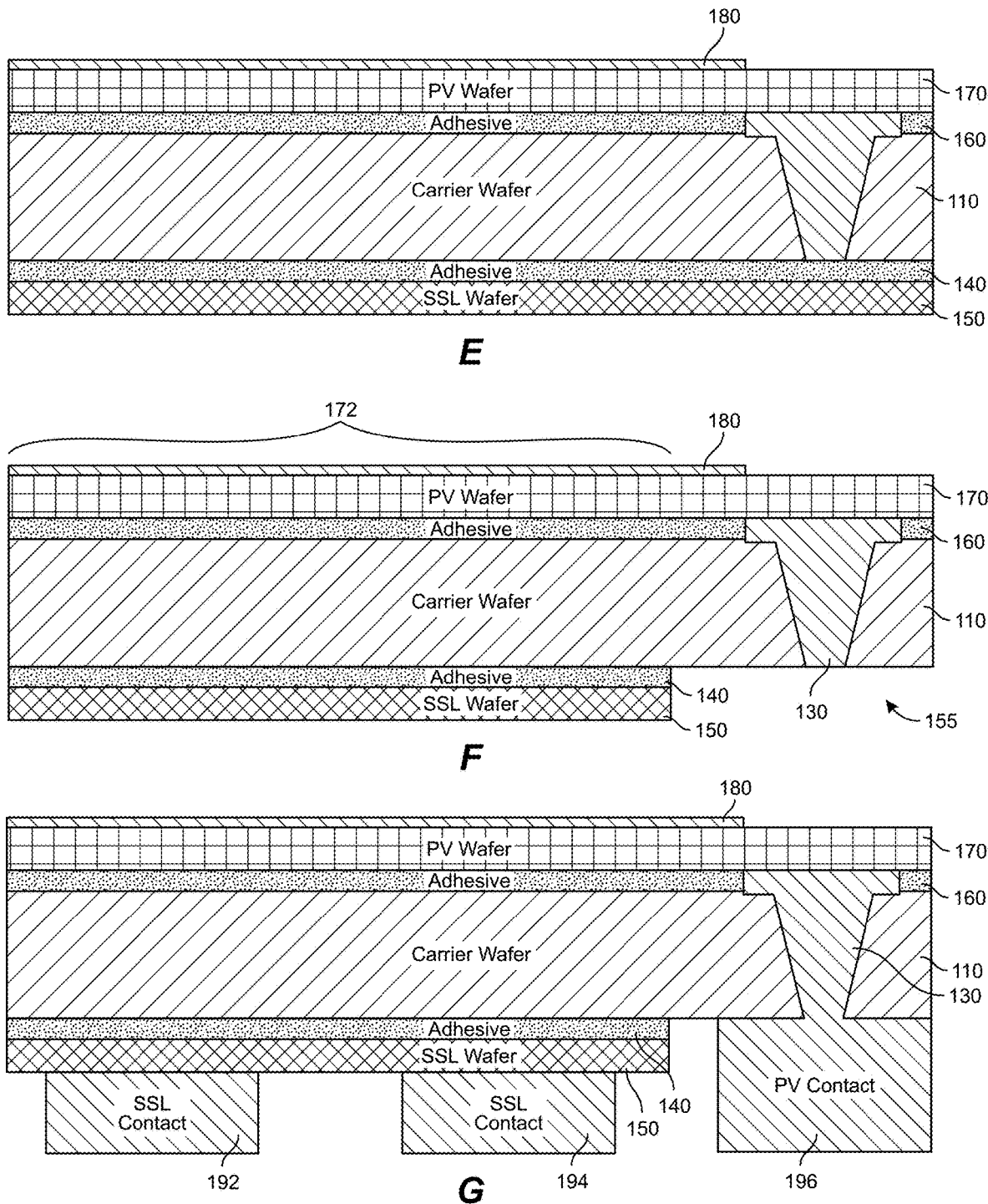

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to transformers, and more particularly to voltage transformers having optical components. A transformer is an electrical device that may be used for power transfer and voltage conversion (e.g., providing a high voltage output from a low voltage input). High voltages may be used to power a variety of different devices and systems, including high voltage relays, cathode ray tubes, e.g., to generate x-rays and particle beams, piezoelectric actuators, e.g., to manipulate the focal length of variable focal length lenses, and haptic devices, among others. In this regard, a voltage transformer may be used to provide and/or increase voltage output where the generated voltage of a device or system is otherwise insufficient.

Many voltage transformers, including step-up converters (booster converters) and piezo-transformers, for example, may be configured to convert relatively low DC input voltages (~1V-2V) to output voltages greater than 1 kV. As disclosed herein, a "high voltage" optical transformer may in some examples be configured to generate a voltage output of at least approximately 100V. Example optical transformers may be configured to provide scalable output, i.e., open-circuit voltages from approximately 100V to greater than approximately 1 kV, e.g., 100, 200, 500, or 1000 V or more, including ranges between any of the foregoing values.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

A high voltage optical transformer (HVOT) typically includes a solid-state light (SSL) source and a photovoltaic (PV) array facing the light source. The light source and the PV array may be optically coupled, e.g., using a variety of integration schemes, such as chip-to-chip level integration. Chip-level integration, however, may include dicing, alignment, and bonding operations for each of a plurality of separate HVOT devices (i.e., source-detector pairs). As such, chip-level integration may be uneconomical in certain implementations.

On the other hand, wafer-level integration may rely on lithographic processes to provide alignment between key components of adjacent wafers with only a few alignment steps. In addition, wafer-level integration of HVOT devices may provide better scalability than chip-level integration approaches. Moreover, with wafer-level integration, further processing and refinement on the photovoltaic side of the device may be possible after wafer bonding.

As disclosed herein, the wafer-level integration of a HVOT device may be implemented using one or more of 3D interconnect technology, wafer bonding technology, and wafer-level packaging technology, and may advantageously resolve one or more chip-level integration issues. In certain embodiments, wafer-level integration may facilitate the formation of electrical contacts (i.e., contacts for both the light source and the PV array) on one side of a carrier wafer, which may simplify and improve the manufacturability of the integrated package.

An optical transformer may include a light source and an array of photovoltaic cells optically coupled to the light source. By way of example, the light source may include a surface-emitting device, e.g., a top- or bottom-emitting device such as a vertical cavity surface emitting laser (VCSEL), a vertical external cavity surface emitting laser (VECSEL), or a light-emitting diode (LED) such as an organic light emitting diode (OLED) or a resonant cavity light emitting diode (RCLED). In some embodiments, the light source may include an edge-emitting device, e.g., a laser diode or a superluminescent diode (SLED). In certain embodiments, the light source may include a single emitter or a plurality of emitters in an addressable array.

By way of example, a light source including a laser diode or a light emitting diode may include an indirect bandgap semiconductor or a direct bandgap semiconductor, such as Si, GaAs, InGaAs, AlGaAs, GaN, InGaN, AlGaN, GaP, GaAsP, AlGaInP, and the like. In some embodiments, the light source may include one or more optical elements configured to enhance light extraction and focusing efficiency, such as one or more micro lenses, total internal reflection (TIR) concentrators and/or total internal reflection-refraction (TIR-R) concentrators.

According to certain embodiments, the optical power generation of the light source and hence the output voltage of the optical transformer may be controlled by voltage or current modulation. Such modulation may be analog (e.g., current amplitude modulation) or digital (e.g., pulse width modulation). A PID control circuit may be used to control the modulation and stabilize the output voltage.

The light source may be configured to illuminate one or more photovoltaic cells, e.g., within a photovoltaic cell array. Example photovoltaic cells may include one or more p-n junctions (or p-i-n junctions) within a semiconductor to obtain a current from photons absorbed near the junction(s). Photovoltaic materials within the photovoltaic cells may include bulk layers, quantum wells, quantum wires, or quantum dots, although further structures are contemplated. As a direct bandgap material, gallium arsenide (GaAs) is highly absorbing to photons having an energy greater than its bandgap ($E_g$). Further example direct bandgap semiconductors suitable for forming the photovoltaic cells include InP, InGaAs, AlGaAs, InGaN, InGaP, InGaAsP, InGaAsPN, AlGaN, GaN, GaP, GaAsP, AlGaInP, and the like. In alternate embodiments, the photovoltaic cells may be manufactured from an indirect bandgap semiconductor such as silicon (Si) or germanium (Ge). For instance, an example monolithic integrated micro photovoltaic cell array may include silicon, where the p-n junctions (or p-i-n junctions) may be formed by lateral doping profiles.

In some embodiments, the light source and the photovoltaic cell array may be in direct contact. In some embodiments, an optical connector may be disposed between the light source and the photovoltaic cell array to guide emitted light from the light source to the photovoltaic cells within the array. An optical connector may include any material suitable for guiding light, including glass, polymer, and/or semiconductor compositions. The optical connector may include crystalline or amorphous materials, for example. In some embodiments, the optical connector may include a solid, a gas, or a liquid. The optical connector may be electrically insulating. To inhibit reflective losses, in certain embodiments, the optical connector may be characterized by a refractive index of at least approximately 1.5.

In some embodiments, the light source may include N emitters or N emitting blocks and the photovoltaic cell array may include N corresponding photovoltaic cells. In further embodiments, the number of emitters may exceed the number of photovoltaic cells. In still further embodiments, the number of photovoltaic cells may exceed the number of emitters. The optical connector may further include a micro lens array or other element(s) configured to focus emitted light onto individual photovoltaic cells, e.g., onto the center of respective photovoltaic cells. In certain embodiments, micrometer-scale photovoltaic cells may be arrayed to form an optical transformer having commercially-relevant dimensions. For example, in combination with a light source powered by a DC voltage source, an optical transformer (DC to DC converter) may exhibit a footprint of less than approximately 1 $mm^3$.

In example HVOTs, a low voltage circuit that controls the light source(s) may be fully decoupled from the high voltage output circuit. Thus, the low voltage circuit may provide a ground loop that is isolated from the high voltage output.

As will be appreciated, high voltage optical transformers may generate smaller magnetic fields than comparative inductive high voltage sources and thus may require substantially less shielding, which may beneficially impact the total weight and thickness of the transformers.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

In certain embodiments, heat produced by the HVOTs may be dissipated using, for example, microfluidic cooling, metallic fibers, liquid metals, heat pipes, and the like. In some embodiments, heat may be directed to nearby devices whose performance may benefit from a higher operational temperature. For example, in a liquid lens, higher temperatures may decrease the viscosity of the enclosed lens fluid, which may increase the response time of the lens.

Various schemes may be used to assemble and mutually align transformer components, including a light source with a light detector. In accordance with various embodiments, a method of forming a high voltage optical transformer may include forming a via through a transparent carrier wafer (optical connector), forming a conductive layer within the via, bonding a solid state lighting (SSL) package to a first side of the carrier wafer, and bonding a photovoltaic (PV) wafer to a second side of the carrier wafer opposite to the first side. The photovoltaic wafer may include an active area and a conductive area located outside of the active area that is in electrical contact with the conductive layer. The method may further include (a) forming an SSL contact to the solid state lighting package, and (b) forming a PV contact to the conductive layer, where each contact is formed on the same side of the carrier wafer. As will be appreciated, mutual alignment of the solid state lighting package and the photovoltaic wafer may include active alignment.

As used herein, in the context of the manufacture of an optical transformer, the term active alignment may, in some examples, refer to a process for aligning a light source (e.g., a solid state light source) with a light detector (e.g., a photovoltaic cell array) to achieve a desirable spatial configuration by evaluating the efficiency of the configuration as a function of the spatial relationship between the source and the detector. Such a process may be implemented by using the configuration to collect and record optical data in real time as the source is moved (e.g., translated, rotated, etc.) relative to the detector. As the light source is moved relative to the detector, the spatial relationship therebetween changes, and the characteristics of the optical data may also change. The optical data may include a measured voltage or a measured power, for example. The efficiency of the light coupling may be used to align the light source relative to the light detector in a desired manner. For example, active alignment may be used to determine a spatial relationship that results in a coupling efficiency between the source and the detector that exceeds a threshold value.

In addition to, or in lieu of active alignment, positioning of the light source and the photovoltaic cell array may, in some embodiments, include the use of a fiducial marker. A subset of the light sources and photovoltaic cells may be used for pre-alignment, for example, and may constitute a dedicated alignment system.

High voltage optical transformers may be integrated into a wide-range of systems and devices, such as where a compact and light-weight form factor are desired. Example applications include user-wearable systems such as liquid lenses and haptic devices, sensors, medical devices such as implantable devices, and communications systems such as drones and satellites.

A liquid lens, for instance, may be driven by bimorph or electrostatic actuators where the HVOT may be incorporated into the lens architecture in close proximity to the actuators, i.e., as part of the wearable system. In further examples, haptic devices may include vibrotactile haptic actuators, such as a dielectric elastomer actuator or an electrostatic clutch.

High voltage optical transformers may also be used to provide power to sensing systems. By way of example, photomultipliers are capable of detecting single photons and have a large range of applications, including chemical and biological sensing, quantum computing, and the monitoring of neuronal activity. Photomultiplier modules themselves may exhibit a commercially-relevant form factor; however, with typical operational voltages in excess of approximately 1 kV, the limited availability of compact, high voltage power supplies has limited their use in many applications.

A number of medical applications may benefit from a compact, high voltage source. Implantable defibrillators, for instance, are currently relatively large devices that use traditional methods and structures to generate high voltages. Such approaches often require the use of heavy components, such as inductors and transformers. HVOTs, on the other hand, may present both a size benefit and a weight benefit to such an application. In some embodiments, a high voltage optical transformer may be mounted in close proximity to a defibrillator, potentially inside the body, decreasing the length of high voltage cables.

With a low voltage input electrically isolated from the high voltage output, the input and output terminals of exemplary HVOTs need not share a common ground, which may significantly decrease the likelihood of electric shock during use. In addition, the output may be characterized by a high impedance. Accordingly, the current between the two output terminals is typically low and insufficient to harm a user. In a similar vein, the HVOTs disclosed herein may be characterized by a relatively low device capacitance, which limits the total charge stored by the transformers. Rather, in accordance with various embodiments, power may be produced on demand through illumination of the PV cells. In some embodiments, the maximum available electric power of an HVOT may be advantageously limited due to self-heating of the device. That is, in the event of a control circuit failure, rapid thermal overloading may restrict the maximum output power.

As a further example, high voltage optical transformers may also be used in miniaturized satellites, such as nano, femto, or pico satellites, where size and weight are often significant parameters.

In certain embodiments, a high voltage optical transformer may be flexible and may be mounted directly on an exemplary device. A "flexible" component, structure, or element (e.g., a flexible high voltage optical transformer) may, in certain embodiments, exhibit a large strain-to-failure, and may accommodate strains of at least approximately 5%, e.g., at least approximately 10%, at least approximately 15%, at least approximately 20%, at least approximately 50%, or at least approximately 100%, including ranges between any of the foregoing values.

A flexible HVOT architecture may be incorporated into wearable systems. The HVOT may be thermally isolated from high voltage driven devices (HVDDs) using, for example, an isolation layer disposed therebetween. A flexible HVOT may include a flexible light source and a thin film array of photovoltaic cells optically coupled to the light source. The flexible light source may include an LED, a micro-LED, an OLED, or a VCSEL, for example. In some embodiments, the flexible light source may include an edge-emitting, or a surface-emitting device coupled to a flexible light guide.

According to some embodiments, a device may include a transparent carrier wafer, a conductive layer extending through the carrier wafer, a solid state lighting (SSL) package bonded to, and optically coupled with, a first side of the carrier wafer, and a photovoltaic (PV) wafer bonded to, and optically coupled with, a second side of the carrier wafer opposite to the first side. The photovoltaic wafer may include an active area facing the carrier wafer. An SSL contact may be disposed over the first side of the carrier wafer in electrical contact with the solid state lighting package whereas a PV contact may be disposed also over the first side of the carrier wafer in electrical contact with the conductive layer. An active or passive alignment scheme may be used to position the solid state lighting (SSL) package with respect to the photovoltaic (PV) wafer.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-7, detailed descriptions of optical transformers, i.e., optically-driven voltage converters, as well as devices and systems using such optical transformers and their methods of manufacture. The discussion associated with FIGS. 1-5 relates to example HVOT device architectures and their methods of manufacture. The discussion associated with FIGS. 6 and 7 relates to exemplary virtual reality and augmented reality devices that may include one or more HVOT devices as disclosed herein.

A process for manufacturing an HVOT that includes the co-integration and active alignment of an SSL wafer with a PV wafer is shown schematically in FIG. 1. Referring to FIG. 1A, a transparent carrier wafer 110 may support the HVOT architecture as well as provide an optical medium through which light may propagate. The transparent carrier wafer 110 may include sapphire or glass, for example, although further transparent materials are contemplated.

A contact via 120 may be formed in the carrier wafer 110. Contact via 120 may be formed by drilling or etching and may extend entirely through the carrier wafer 110 within a selected region thereof. In some embodiments, contact via 120 may have a circular cross section and may include substantially straight sidewalls 122. In some embodiments, the sidewalls 122 of contact via 120 may be substantially vertical or, as illustrated, the sidewalls 122 may have a tapered profile.

A deposition process, optionally in conjunction with a masking process, may be used to fill the contact via 120 with a layer of electrically conductive material 130. An example electrically conductive material layer 130 may include copper, although other electrically conductive materials, including metals and metal alloys, may be used. By way of example, the electrically conductive material layer 130 may be formed by electroplating, chemical plating, atomic layer deposition (ALD), chemical vapor deposition (CVD), or physical vapor deposition (PVD).

Referring still to FIG. 1A, a portion of the electrically conductive material layer 130 may be polished to remove the overburden as well as planarize or substantially planarize the structure. In some embodiments, a grinding or chemical mechanical polishing (CMP) process may be used to remove excess portions of the electrically conductive material layer 130 and expose a top surface of the carrier wafer outside of the selected region. A CMP process may be adapted to selectively remove the electrically conductive material. By way of example, a process for removing metals, such as copper, may have a selectivity with respect to oxides, such as sapphire, of at least approximately 10:1, e.g., 10:1, 20:1, 30:1, or 40:1, including ranges between any of the foregoing ratios.

In some embodiments, to facilitate electrical contact with an overlying layer, the layer of electrically conductive material 130 may include a contact pad 132 that is raised above and extends partially over a top surface of the carrier wafer 110. Contact pad 132 may be formed during deposition of the conductive material layer 130, e.g., by using a suitable block mask (not shown), as known to those skilled in the art.

Referring to FIG. 1B, an adhesive layer 140 may be used to bond an SSL wafer 150 to the carrier wafer 110. By way of example, the adhesive layer 140 may include an ultrathin layer of divinylsiloxane-bis-benzocyclobutene (DVS-BCB), although further adhesive compositions may be used, including various epoxies and thermoplastics.

Referring to FIG. 1C, a hybrid adhesive layer 160 may be formed over the carrier wafer 110, i.e., opposite to adhesive layer 140. In some embodiments, a thermal compression molding process may be used to both mechanically bond a PV wafer 170 to the carrier wafer 110 and electrically connect the PV wafer 170 to the conductive material layer 130 using the hybrid adhesive layer 160. The hybrid adhesive layer 160 may include, for example, a mixture of adhesive and conductive components.

According to some embodiments, active alignment of the SSL wafer 150 with the PV wafer 170 may be performed while power is applied to the SSL wafer 150. In a similar vein, according to an alternate, unillustrated embodiment, an active alignment scheme may be used to align an SSL chip and a PV chip that may be separated by an intervening transparent carrier.

Turning to FIG. 1D and FIG. 1E, and with reference also to FIG. 1C, after bonding the SSL wafer 150 and the PV wafer 170 to the carrier wafer 110, lapping or grinding processes may be used to decrease the thickness of the SSL wafer 150 and the thickness of the PV wafer 170. Thinning of the SSL wafer 150, for instance, may improve accessibility to corresponding metal contacts (e.g., conductive material layer 130), and thinning of the PV wafer 170 may decrease electrical leakage of the HVOT during operation. Thereafter, as shown in FIG. 1E, a reflective layer 180 may be formed over a surface of the PV wafer 170. The reflective layer 180 may be configured to reflect unabsorbed light and improve the transport of photo-generated carriers, which may increase the photo-generated current and decrease the series resistance of the PV cell array and improve the overall efficiency of the HVOT.

Referring to FIG. 1F, following thinning of the SSL wafer 150, a portion of the SSL wafer and a corresponding portion of the adhesive layer 140 may be removed to expose electrically conductive material layer 130 and form a contact region 155. Thereafter, as shown in FIG. 1G, SSL contacts 192, 194, and PV contact 196 may be formed over the SSL wafer 150 and over the conductive material layer 130 within contact region 155 on a common side of the device. In certain embodiments, a surface of SSL contacts 192, 194 and a surface of the PV contact 196 may be co-planar.

Figure 2:
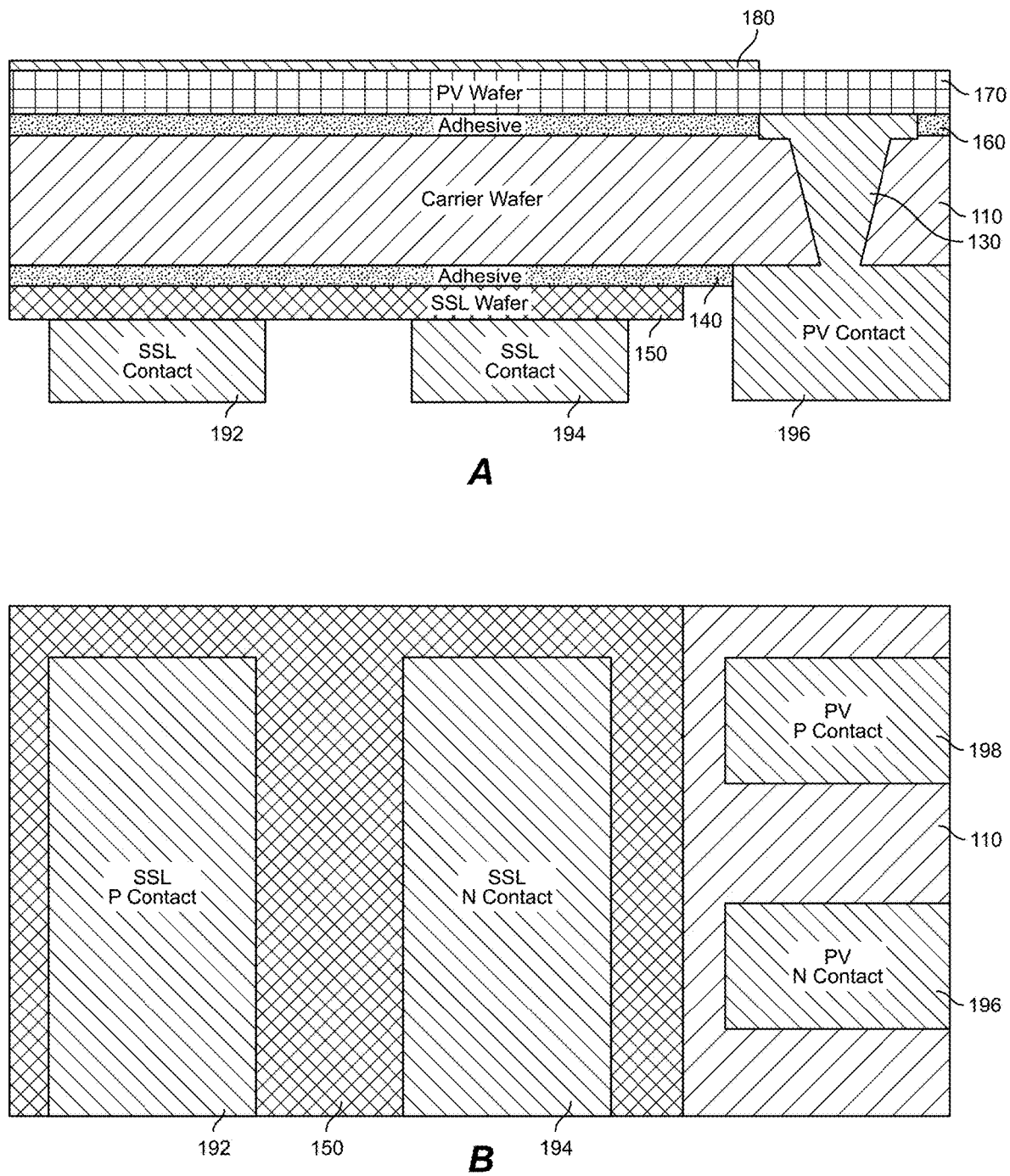
FIG. 2 shows cross-sectional and plan view schematic illustrations of the high voltage optical transformer manufactured according to the method of FIG. 1 according to some embodiments.

A resultant HVOT structure following the integration and active alignment of SSL and PV wafers, including the formation of a light reflective layer to improve performance, is shown in FIG. 2. A cross-sectional view and a bottom-up plan view of the exemplary HVOT device are shown in FIG. 2A and FIG. 2B, respectively. A reflective layer 180 may be formed over PV wafer 170 and aligned with or substantially aligned with an active area 172 of PV wafer 170, while SSL contacts 192, 194 and PV contacts 196, 198 may be coplanar and disposed on the same side of the device.

Figure 3:
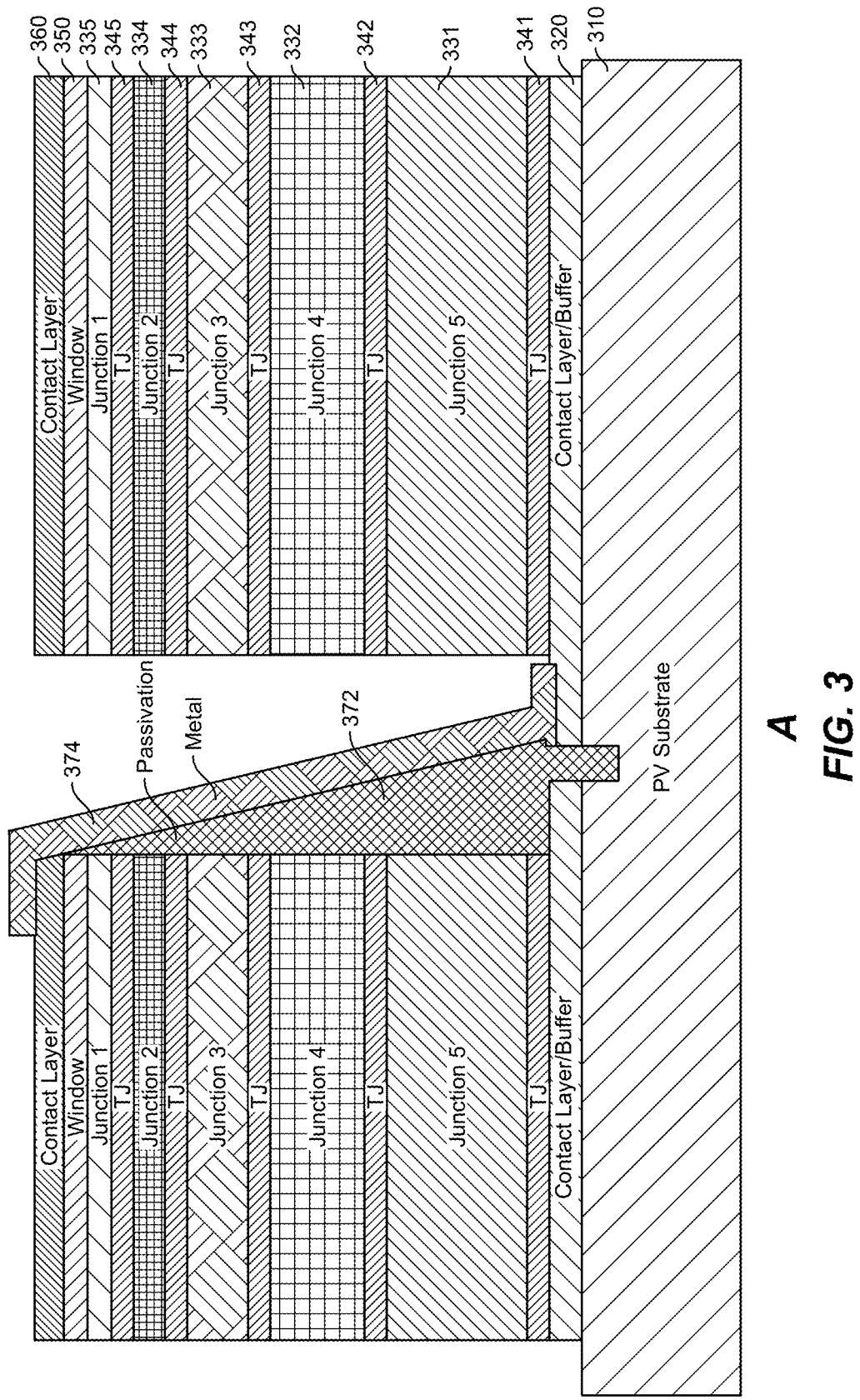
FIG. 3 illustrates a method of manufacturing a high voltage optical transformer according to further embodiments.
Figure 3:
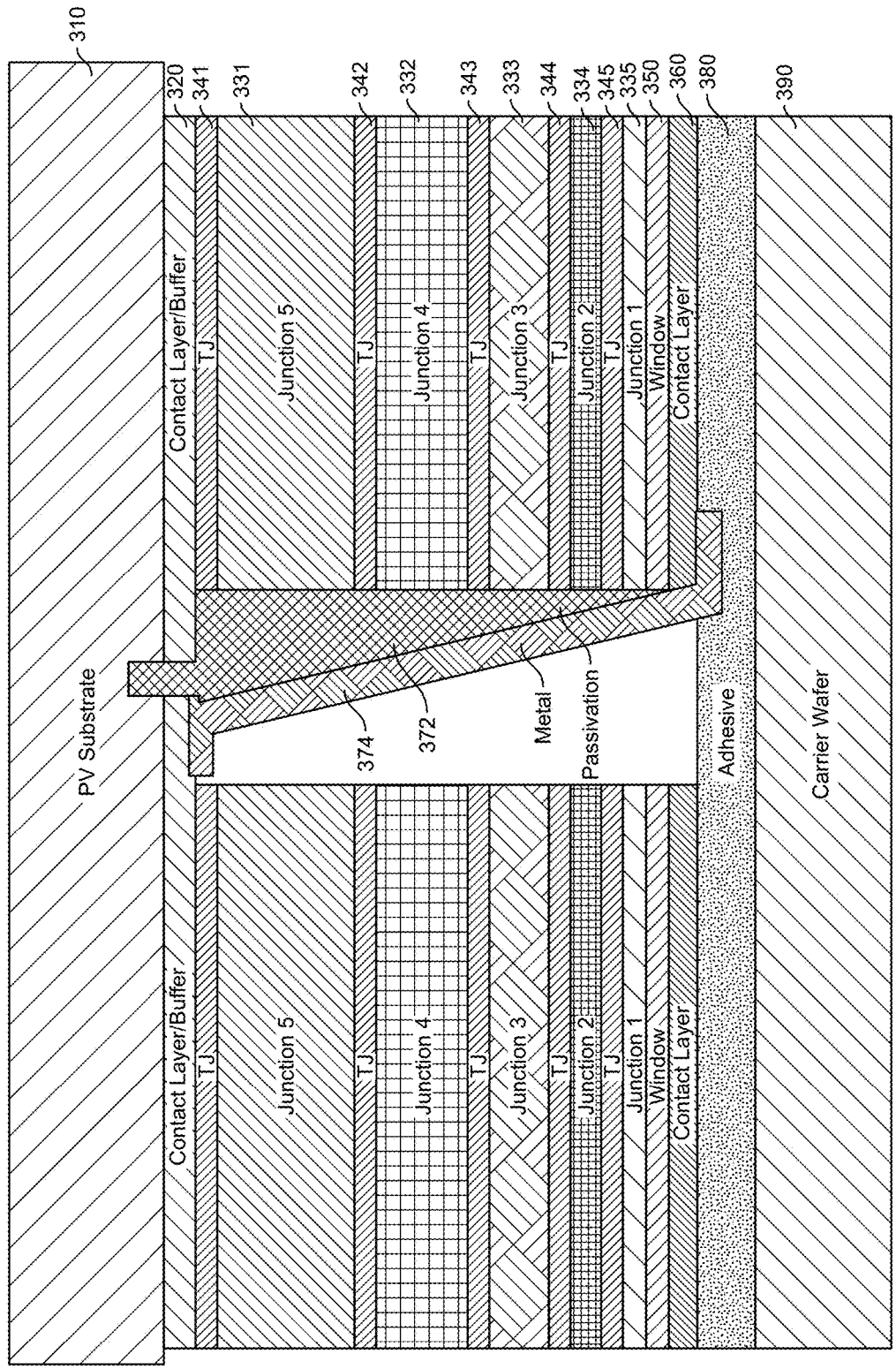
Figure 3:
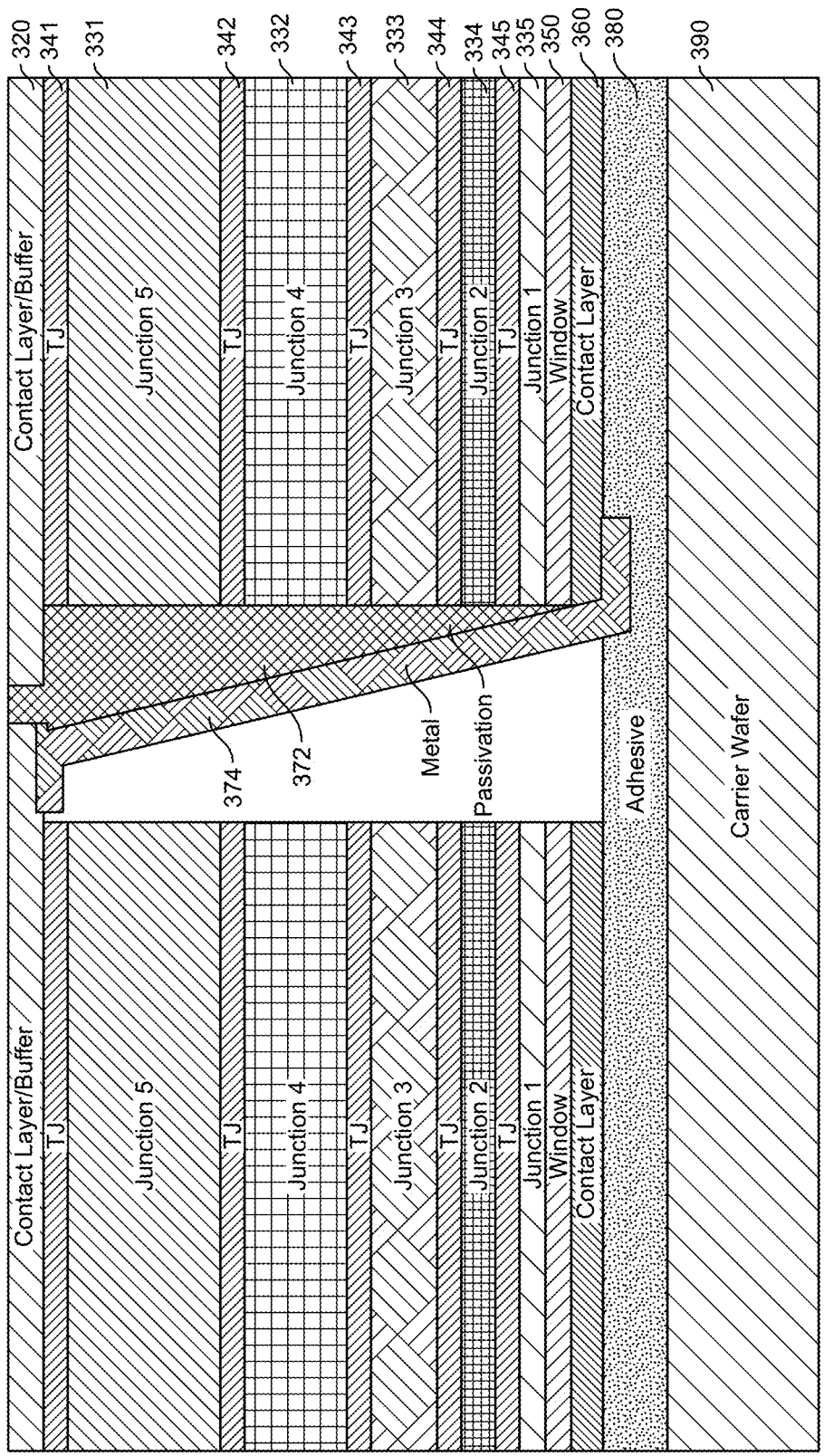
Figure 3:
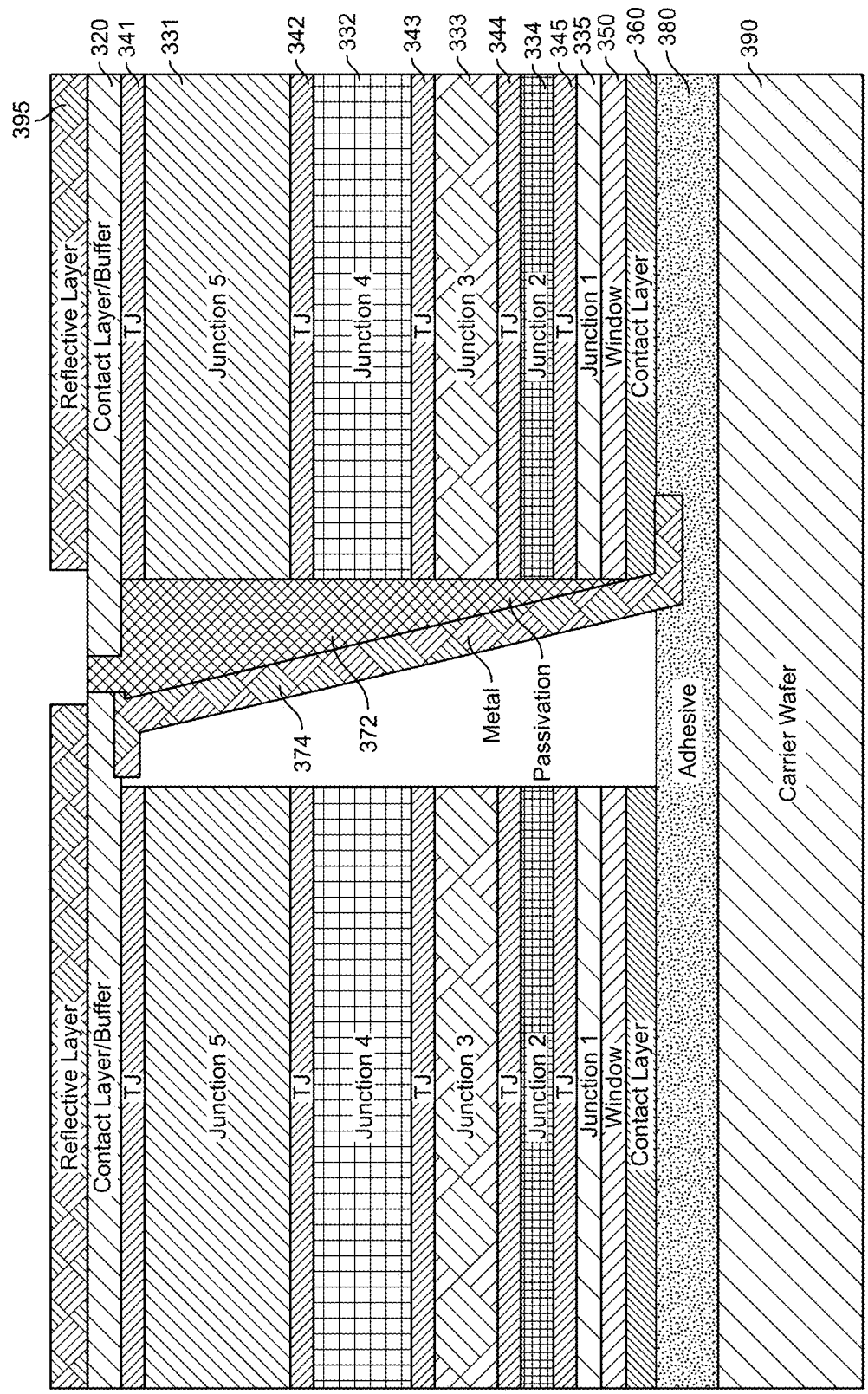

A process for manufacturing an HVOT that includes removal of the PV substrate and the incorporation of a reflective layer to enhance charge current collection and redirect unabsorbed photons is shown schematically in FIG. 3.

Referring to FIG. 3A, a single or multijunction photovoltaic element may be formed over a PV substrate. In the illustrated embodiment, a multijunction element may include a stack of epitaxial layers defining intervening tunnel junctions. Plural individual PV cells may be arrayed in series. The example structure includes, from bottom to top, a PV substrate 310, a bottom contact layer 320, and respective five layer stacks of epitaxial layers 331-335 with intervening highly-doped tunnel junctions 341-345, a transparent window 350, and a top contact layer 360 that define individual PV cells 301 and 302.

In some embodiments, the PV substrate 310 may include GaAs. Bottom contact layer 320 may include any suitable electrically conductive layer and may additionally include a buffer layer (not separately shown). An epitaxial growth process may be used to form epitaxial layers 331-335, where doping of the tunnel junctions 341-345 may be performed in situ.

Example epitaxial growth processes include low energy plasma deposition, liquid phase epitaxy, molecular beam epitaxy, metalorganic chemical vapor deposition, and atmospheric pressure chemical vapor deposition. The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation.

The transparent window 350 may be configured as a transition layer between the multijunction stack and the top contact layer 360 and may include, for example, an approximately 800 nm thick to an approximately 1000 nm thick layer of InGaP or AlGaAs. Top contact 360 may include a transparent conductive oxide, such as indium tin oxide (ITO).

In certain embodiments, the thickness of successive epitaxial layers 331-335 may increase along a light propagation direction through the stack in order to realize a constant photo-generated current from each junction. An absorption coefficient for each of the epitaxial layers 331-335 may be used to calculate the respective thickness of each layer.

Between first cell 301 and second cell 302, a passivation layer 372 may be formed over a sidewall of the first cell 301, and a conductive strap 374 may be formed over the passivation layer 372 to electrically connect the top contact 360 of the first cell 301 with the bottom contact 320 of the second cell 302.

Referring to FIG. 3B, the structure of FIG. 3A may be reoriented and bonded via adhesive layer 380 to a carrier wafer 390. Thereafter, referring to FIG. 3C, the PV substrate may be removed (e.g., using one or more of etching, grinding, lapping, polishing, epitaxial lift-off, and the like) and, as shown in FIG. 3D, a light reflective layer 395 may be deposited over each individual PV cell 301, 302. The light reflective layer 395 may be isolated between adjacent cells and configured to enhance backside electrical conductivity as well as recycle unabsorbed photons back to the PV cells.

Figure 4:
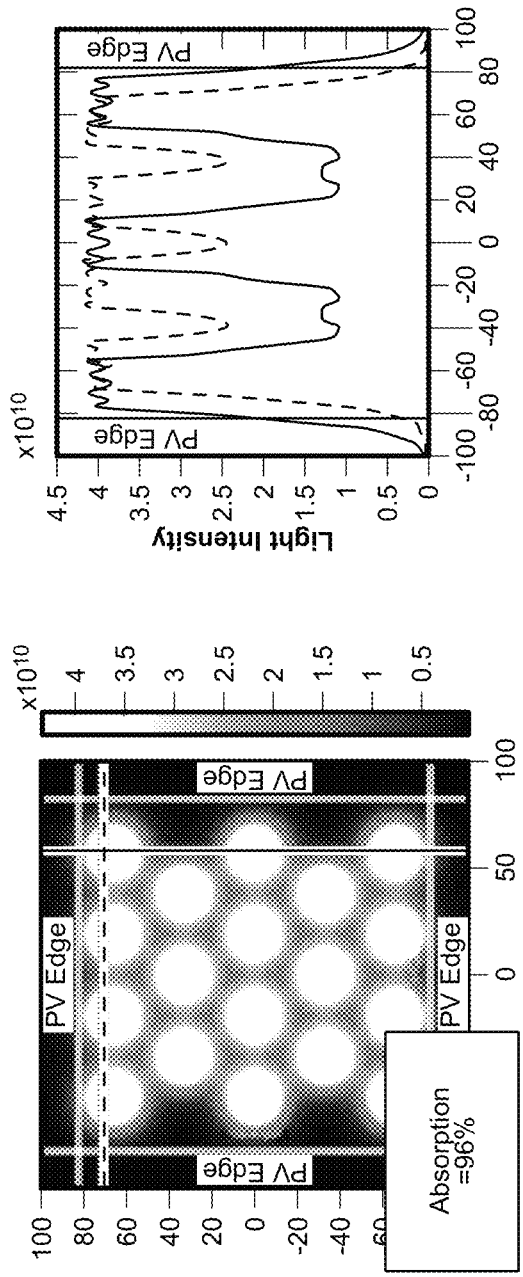
FIG. 4 illustrates simulated data of light emitted from an 18-emitter VCSEL sub-cell with 20° beam divergence impinging upon a PV sub-cell active area having a 100 micrometer thick sapphire carrier wafer according to certain embodiments.
Figure 5:
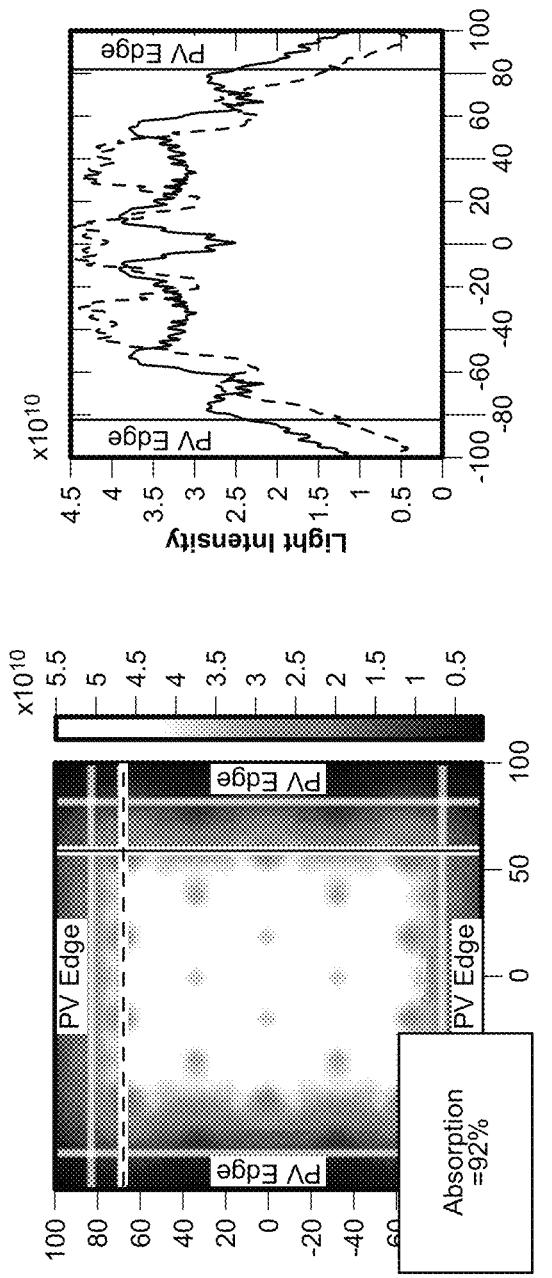
FIG. 5 illustrates simulated data of light emitted from an 18-emitter VCSEL sub-cell with 20° beam divergence impinging upon a PV sub-cell active area having a 200 micrometer thick sapphire carrier wafer according to certain embodiments.
Figure 5:
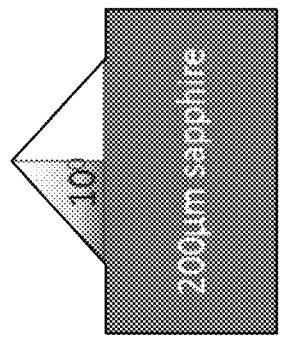

FIGS. 4 and 5 are modeled results depicting the amount of light from a VCSEL solid-state light source with 18-emitters per sub-cell that illuminates a 165 μm×165 μm PV sub-cell with either a 100 μm or 200 μm sapphire transparent carrier. The assumption for the VCSEL divergence angle is 20° at $1/e^2$ intensity.

The manufacture of high voltage optical transformer (HVOT) devices typically includes passive or active alignment between a light source and a photovoltaic (PV) array for each device. Whereas comparative chip-level alignment paradigms may require many thousands of alignment steps, wafer-level integration may be used to produce excellent alignment between key components with just a few steps. In particular embodiments, the coupling and integration of a solid state light source with a photovoltaic array can be performed at the wafer-level using 3D interconnect, wafer bonding, and wafer-level packaging technologies. Wafer-level integration of HVOT devices may provide better scalability compared with chip-level integration, and with wafer-level integration methods, further device optimization on the photovoltaic side of the device may be possible after wafer bonding. In a resulting HVOT device, light source and PV array contacts may be co-planar or may be located on either side of the device.

Example Embodiments

Example 1: A method includes forming a via through a transparent carrier wafer, forming a conductive layer within the via, bonding a solid state lighting (SSL) package to a first side of the carrier wafer, bonding a photovoltaic (PV) wafer to a second side of the carrier wafer opposite to the first side, where the photovoltaic wafer includes an active area and a conductive area located outside of the active area, the conductive area being in electrical contact with the conductive layer, forming an SSL contact over the solid state lighting package on the first side of the carrier wafer, and forming a PV contact over the conductive layer on the first side of the carrier wafer.

Example 2: The method of Example 1, where forming the via includes drilling or etching entirely through the carrier wafer.

Example 3: The method of any of Example 1 and 2, where the carrier wafer includes sapphire or glass.

Example 4: The method of any of Examples 1-3, where the conductive layer includes copper.

Example 5: The method of any of Examples 1-4, where a light emission side of the solid state lighting package faces the carrier wafer.

Example 6: The method of any of Examples 1-5, where the active area of the photovoltaic wafer faces the carrier wafer.

Example 7: The method of any of Examples 1-6, where bonding the photovoltaic wafer to the carrier wafer includes forming a hybrid adhesive and conductive layer between the photovoltaic wafer and the carrier wafer.

Example 8: The method of Example 7, where the hybrid adhesive layer includes a substantially planar surface.

Example 9: The method of any of Examples 1-8, further including thinning the solid state lighting package.

Example 10: The method of any of Examples 1-9, further including thinning the photovoltaic wafer.

Example 11: The method of any of Examples 1-10, further including forming a reflective layer over the photovoltaic wafer opposite to the conductive area and overlying at least a portion of the active area.

Example 12: The method of any of Examples 1-11, where a surface of the SSL contact and a surface of the PV contact are substantially co-planar.

Example 13: The method of any of Examples 1-12, where the solid state lighting package and the active area are aligned while applying power to the solid state lighting package.

Example 14: The method of any of Examples 1-13, where at least approximately 85% of the light emitted by the solid state lighting package illuminates the active area.

Example 15: A method includes forming a via through a transparent carrier wafer, forming a conductive layer within the via, bonding a solid state lighting (SSL) package to a first side of the carrier wafer, bonding a photovoltaic (PV) wafer to a second side of the carrier wafer opposite to the first side, wherein the photovoltaic wafer includes an active area and a conductive area located outside of the active area in electrical contact with the conductive layer, forming an SSL contact over the solid state lighting package, and forming a PV contact over the conductive layer, where the SSL contact and the PV contact are substantially-coplanar.

Example 16: The method of Example 15, further including forming a hybrid adhesive layer between the photovoltaic wafer and the carrier wafer.

Example 17: A device includes a transparent carrier wafer, a conductive layer extending through the carrier wafer, a solid state lighting (SSL) package bonded to a first side of the carrier wafer, a photovoltaic (PV) wafer bonded to a second side of the carrier wafer opposite to the first side, the photovoltaic wafer including an active area facing the carrier wafer, an SSL contact disposed over the first side of the carrier wafer in electrical contact with the solid state lighting package, and a PV contact disposed over the first side of the carrier wafer in electrical contact with the conductive layer.

Example 18: The device of Example 17, where a surface of the SSL contact and a surface of the PV contact are substantially co-planar.

Example 19: The device of any of Examples 17 and 18, further including a reflective layer disposed over the photovoltaic wafer opposite to the solid state lighting package and overlying at least a portion of the active area.

Example 20: The device of any of Examples 17-19, where the reflective layer is configured to redirect unabsorbed photons emitted by the solid state lighting package into the active area.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 600 in FIG. 6) or that visually immerses a user in an artificial reality (such as, e.g., virtual-reality system 700 in FIG. 7). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 6:
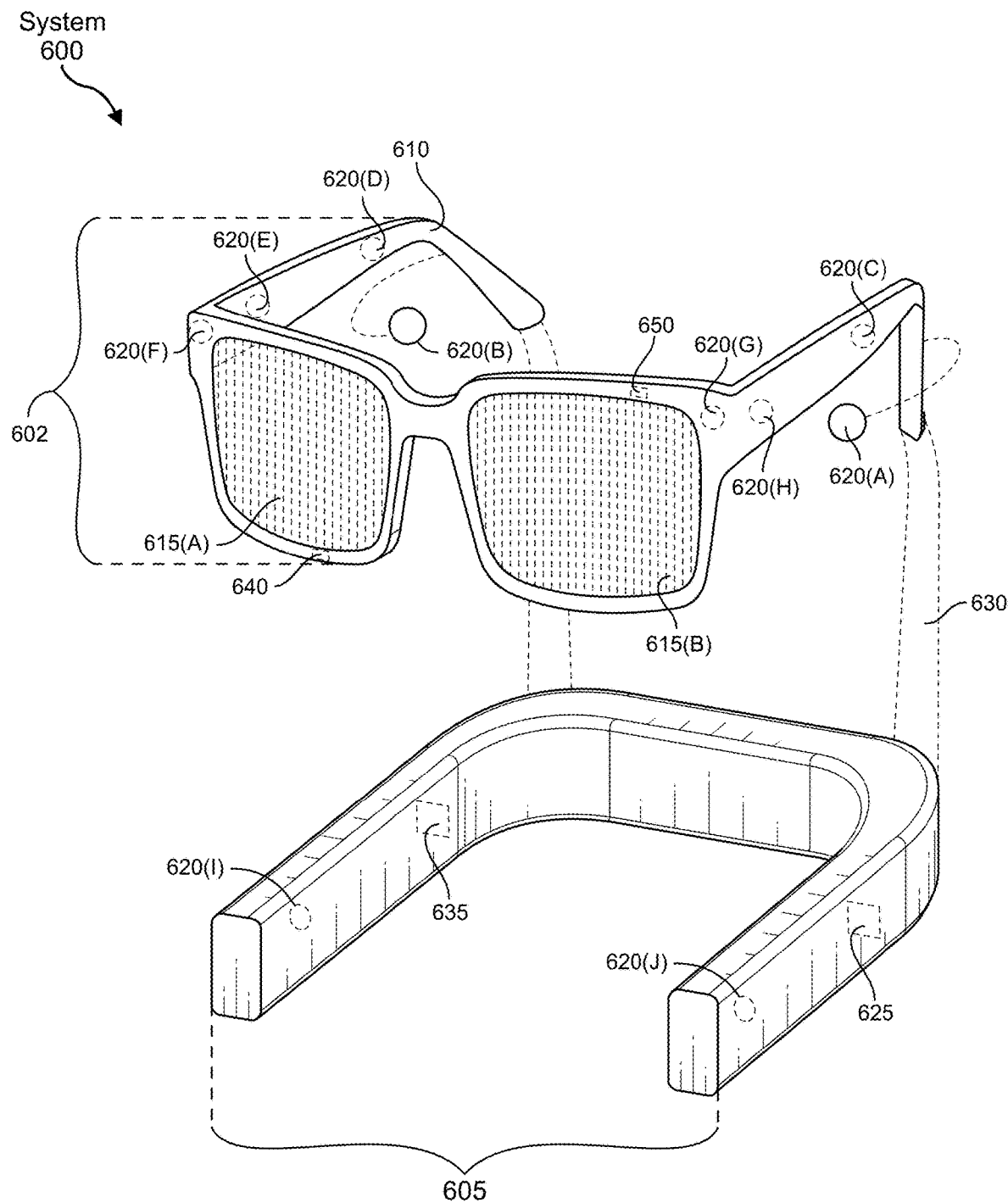
FIG. 6 is an illustration of exemplary augmented-reality glasses that may be used in connection with embodiments of this disclosure.
Figure 7:
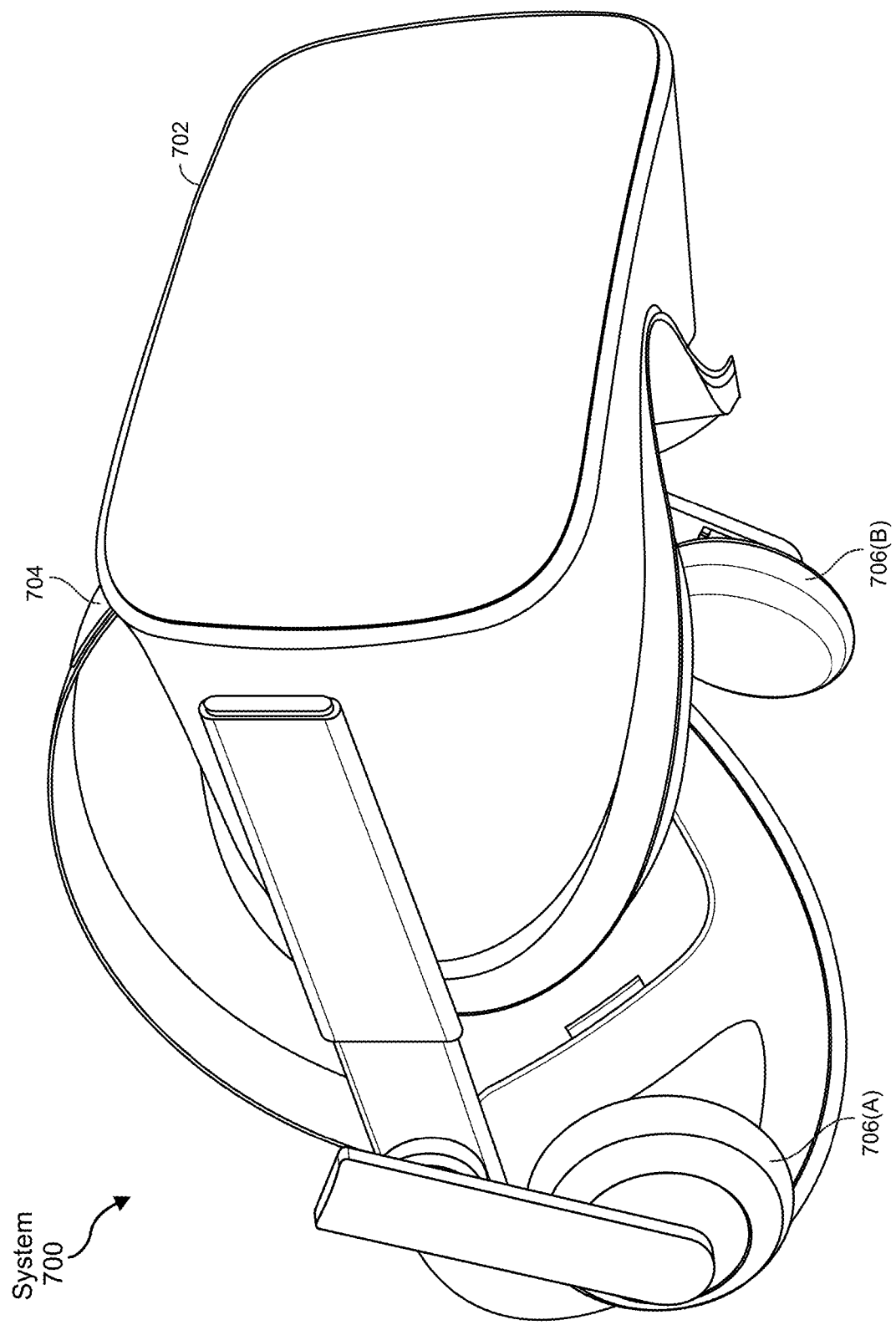
FIG. 7 is an illustration of an exemplary virtual-reality headset that may be used in connection with embodiments of this disclosure.

Turning to FIG. 6, augmented-reality system 600 may include an eyewear device 602 with a frame 610 configured to hold a left display device 615(A) and a right display device 615(B) in front of a user's eyes. Display devices 615(A) and 615(B) may act together or independently to present an image or series of images to a user. While augmented-reality system 600 includes two displays, embodiments of this disclosure may be implemented in augmented-reality systems with a single NED or more than two NEDs.

In some embodiments, augmented-reality system 600 may include one or more sensors, such as sensor 640. Sensor 640 may generate measurement signals in response to motion of augmented-reality system 600 and may be located on substantially any portion of frame 610. Sensor 640 may represent one or more of a variety of different sensing mechanisms, such as a position sensor, an inertial measurement unit (IMU), a depth camera assembly, a structured light emitter and/or detector, or any combination thereof. In some embodiments, augmented-reality system 600 may or may not include sensor 640 or may include more than one sensor. In embodiments in which sensor 640 includes an IMU, the IMU may generate calibration data based on measurement signals from sensor 640. Examples of sensor 640 may include, without limitation, accelerometers, gyroscopes, magnetometers, other suitable types of sensors that detect motion, sensors used for error correction of the IMU, or some combination thereof.

In some examples, augmented-reality system 600 may also include a microphone array with a plurality of acoustic transducers 620(A)-620(J), referred to collectively as acoustic transducers 620. Acoustic transducers 620 may represent transducers that detect air pressure variations induced by sound waves. Each acoustic transducer 620 may be configured to detect sound and convert the detected sound into an electronic format (e.g., an analog or digital format). The microphone array in FIG. 6 may include, for example, ten acoustic transducers: 620(A) and 620(B), which may be designed to be placed inside a corresponding ear of the user, acoustic transducers 620(C), 620(D), 620(E), 620(F), 620(G), and 620(H), which may be positioned at various locations on frame 610, and/or acoustic transducers 620(I) and 620(J), which may be positioned on a corresponding neckband 605.

In some embodiments, one or more of acoustic transducers 620(A)-(J) may be used as output transducers (e.g., speakers). For example, acoustic transducers 620(A) and/or 620(B) may be earbuds or any other suitable type of headphone or speaker.

The configuration of acoustic transducers 620 of the microphone array may vary. While augmented-reality system 600 is shown in FIG. 6 as having ten acoustic transducers 620, the number of acoustic transducers 620 may be greater or less than ten. In some embodiments, using higher numbers of acoustic transducers 620 may increase the amount of audio information collected and/or the sensitivity and accuracy of the audio information. In contrast, using a lower number of acoustic transducers 620 may decrease the computing power required by an associated controller 650 to process the collected audio information. In addition, the position of each acoustic transducer 620 of the microphone array may vary. For example, the position of an acoustic transducer 620 may include a defined position on the user, a defined coordinate on frame 610, an orientation associated with each acoustic transducer 620, or some combination thereof.

Acoustic transducers 620(A) and 620(B) may be positioned on different parts of the user's ear, such as behind the pinna, behind the tragus, and/or within the auricle or fossa. Or, there may be additional acoustic transducers 620 on or surrounding the ear in addition to acoustic transducers 620 inside the ear canal. Having an acoustic transducer 620 positioned next to an ear canal of a user may enable the microphone array to collect information on how sounds arrive at the ear canal. By positioning at least two of acoustic transducers 620 on either side of a user's head (e.g., as binaural microphones), augmented-reality device 600 may simulate binaural hearing and capture a 3D stereo sound field around about a user's head. In some embodiments, acoustic transducers 620(A) and 620(B) may be connected to augmented-reality system 600 via a wired connection 630, and in other embodiments acoustic transducers 620(A) and 620(B) may be connected to augmented-reality system 600 via a wireless connection (e.g., a BLUETOOTH connection). In still other embodiments, acoustic transducers 620(A) and 620(B) may not be used at all in conjunction with augmented-reality system 600.

Acoustic transducers 620 on frame 610 may be positioned in a variety of different ways, including along the length of the temples, across the bridge, above or below display devices 615(A) and 615(B), or some combination thereof. Acoustic transducers 620 may also be oriented such that the microphone array is able to detect sounds in a wide range of directions surrounding the user wearing the augmented-reality system 600. In some embodiments, an optimization process may be performed during manufacturing of augmented-reality system 600 to determine relative positioning of each acoustic transducer 620 in the microphone array.

In some examples, augmented-reality system 600 may include or be connected to an external device (e.g., a paired device), such as neckband 605. Neckband 605 generally represents any type or form of paired device. Thus, the following discussion of neckband 605 may also apply to various other paired devices, such as charging cases, smart watches, smart phones, wrist bands, other wearable devices, hand-held controllers, tablet computers, laptop computers, other external compute devices, etc.

As shown, neckband 605 may be coupled to eyewear device 602 via one or more connectors. The connectors may be wired or wireless and may include electrical and/or non-electrical (e.g., structural) components. In some cases, eyewear device 602 and neckband 605 may operate independently without any wired or wireless connection between them. While FIG. 6 illustrates the components of eyewear device 602 and neckband 605 in example locations on eyewear device 602 and neckband 605, the components may be located elsewhere and/or distributed differently on eyewear device 602 and/or neckband 605. In some embodiments, the components of eyewear device 602 and neckband 605 may be located on one or more additional peripheral devices paired with eyewear device 602, neckband 605, or some combination thereof.

Pairing external devices, such as neckband 605, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 600 may be provided by a paired device or shared between a paired device and an eyewear device, thus reducing the weight, heat profile, and form factor of the eyewear device overall while still retaining desired functionality. For example, neckband 605 may allow components that would otherwise be included on an eyewear device to be included in neckband 605 since users may tolerate a heavier weight load on their shoulders than they would tolerate on their heads. Neckband 605 may also have a larger surface area over which to diffuse and disperse heat to the ambient environment. Thus, neckband 605 may allow for greater battery and computation capacity than might otherwise have been possible on a stand-alone eyewear device. Since weight carried in neckband 605 may be less invasive to a user than weight carried in eyewear device 602, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 605 may be communicatively coupled with eyewear device 602 and/or to other devices. These other devices may provide certain functions (e.g., tracking, localizing, depth mapping, processing, storage, etc.) to augmented-reality system 600. In the embodiment of FIG. 6, neckband 605 may include two acoustic transducers (e.g., 620(1) and 620(J)) that are part of the microphone array (or potentially form their own microphone subarray). Neckband 605 may also include a controller 625 and a power source 635.

Acoustic transducers 620(1) and 620(J) of neckband 605 may be configured to detect sound and convert the detected sound into an electronic format (analog or digital). In the embodiment of FIG. 6, acoustic transducers 620(1) and 620(J) may be positioned on neckband 605, thereby increasing the distance between the neckband acoustic transducers 620(1) and 620(J) and other acoustic transducers 620 positioned on eyewear device 602. In some cases, increasing the distance between acoustic transducers 620 of the microphone array may improve the accuracy of beamforming performed via the microphone array. For example, if a sound is detected by acoustic transducers 620(C) and 620(D) and the distance between acoustic transducers 620(C) and 620(D) is greater than, e.g., the distance between acoustic transducers 620(D) and 620(E), the determined source location of the detected sound may be more accurate than if the sound had been detected by acoustic transducers 620(D) and 620(E).

Controller 625 of neckband 605 may process information generated by the sensors on neckband 605 and/or augmented-reality system 600. For example, controller 625 may process information from the microphone array that describes sounds detected by the microphone array. For each detected sound, controller 625 may perform a direction-of-arrival (DOA) estimation to estimate a direction from which the detected sound arrived at the microphone array. As the microphone array detects sounds, controller 625 may populate an audio data set with the information. In embodiments in which augmented-reality system 600 includes an inertial measurement unit, controller 625 may compute all inertial and spatial calculations from the IMU located on eyewear device 602. A connector may convey information between augmented-reality system 600 and neckband 605 and between augmented-reality system 600 and controller 625. The information may be in the form of optical data, electrical data, wireless data, or any other transmittable data form. Moving the processing of information generated by augmented-reality system 600 to neckband 605 may reduce weight and heat in eyewear device 602, making it more comfortable to the user.

Power source 635 in neckband 605 may provide power to eyewear device 602 and/or to neckband 605. Power source 635 may include, without limitation, lithium ion batteries, lithium-polymer batteries, primary lithium batteries, alkaline batteries, or any other form of power storage. In some cases, power source 635 may be a wired power source. Including power source 635 on neckband 605 instead of on eyewear device 602 may help better distribute the weight and heat generated by power source 635.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 700 in FIG. 7, that mostly or completely covers a user's field of view. Virtual-reality system 700 may include a front rigid body 702 and a band 704 shaped to fit around a user's head. Virtual-reality system 700 may also include output audio transducers 706(A) and 706(B). Furthermore, while not shown in FIG. 7, front rigid body 702 may include one or more electronic elements, including one or more electronic displays, one or more inertial measurement units (IMUS), one or more tracking emitters or detectors, and/or any other suitable device or system for creating an artificial-reality experience.

Artificial-reality systems may include a variety of types of visual feedback mechanisms. For example, display devices in augmented-reality system 600 and/or virtual-reality system 700 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 600 and/or virtual-reality system 700 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 600 and/or virtual-reality system 700 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As described herein, the formation or deposition of a layer or structure, including the foregoing layers and structures, may involve one or more techniques suitable for the material or layer being deposited or the structure being formed. In addition to techniques or methods specifically mentioned, various techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a metallization layer that comprises or includes aluminum include embodiments where a metallization layer consists essentially of aluminum and embodiments where a metallization layer consists of aluminum.

What is claimed is:

1. A method comprising:
   forming a via through a transparent carrier wafer;
   forming a conductive layer within the via;
   bonding a solid state lighting (SSL) package to a first side of the carrier wafer;
   bonding a photovoltaic (PV) wafer to a second side of the carrier wafer opposite to the first side, wherein the photovoltaic wafer comprises an active area and a conductive area located outside of the active area, the conductive area being in electrical contact with the conductive layer;
   forming an SSL contact over the solid state lighting package on the first side of the carrier wafer; and
   forming a PV contact over the conductive layer on the first side of the carrier wafer.

2. The method of claim 1, wherein forming the via comprises drilling or etching entirely through the carrier wafer.

3. The method of claim 1, wherein the carrier wafer comprises sapphire or glass.

4. The method of claim 1, wherein the conductive layer comprises copper.

5. The method of claim 1, wherein a light emission side of the solid state lighting package faces the carrier wafer.

6. The method of claim 1, wherein the active area of the photovoltaic wafer faces the carrier wafer.

7. The method of claim 1, wherein bonding the photovoltaic wafer to the carrier wafer comprises forming a hybrid adhesive and conductive layers between the photovoltaic wafer and the carrier wafer.

8. The method of claim 7, wherein the hybrid adhesive layer comprises a substantially planar surface.

9. The method of claim 1, further comprising thinning the solid state lighting package.

10. The method of claim 1, further comprising thinning the photovoltaic wafer.

11. The method of claim 1, further comprising forming a reflective layer over the photovoltaic wafer opposite to the conductive area and overlying at least a portion of the active area.

12. The method of claim 1, wherein a surface of the SSL contact and a surface of the PV contact are substantially co-planar.

13. The method of claim 1, further comprising applying power to the solid state lighting package, wherein the solid state lighting package and the active area are aligned while applying the power.

14. A method comprising:
   forming a via through a transparent carrier wafer;
   forming a conductive layer within the via;
   bonding a solid state lighting (SSL) package to a first side of the carrier wafer;
   bonding a photovoltaic (PV) wafer to a second side of the carrier wafer opposite to the first side, wherein the photovoltaic wafer comprises an active area and a conductive area located outside of the active area in electrical contact with the conductive layer;
   forming an SSL contact over the solid state lighting package; and
   forming a PV contact over the conductive layer, wherein the SSL contact and the PV contact are substantially-coplanar.

15. The method of claim 14, further comprising forming a hybrid adhesive layer between the photovoltaic wafer and the carrier wafer prior to bonding the photovoltaic wafer to the second side of the carrier wafer.

16. The method of claim 1, further comprising removing a portion of the solid state lighting (SSL) package to expose the conductive layer on the first side of the carrier wafer prior to forming the PV contact.

* * * * *